US012695543B2

(12) United States Patent
Siaud et al.

(10) Patent No.: US 12,695,543 B2
(45) Date of Patent: Jul. 28, 2026

(54) DATA TRANSMISSION METHOD WITH VARIABLE PUNCTURING BETWEEN CONSTELLATION SYMBOLS ACCORDING TO THE LOCATION THEREOF

(71) Applicant: ORANGE, Issy-les-Moulineaux (FR)

(72) Inventors: Isabelle Siaud, Chatillon Cedex (FR); Anne-Marie Ulmer-Moll, Chatillon Cedex (FR)

(73) Assignee: ORANGE, Issy-les-Moulineaux (FR)

( * ) Notice: Subject to any disclaimer, the term of this patent is extended or adjusted under 35 U.S.C. 154(b) by 280 days.

(21) Appl. No.: 18/556,940

(22) PCT Filed: Apr. 21, 2022

(86) PCT No.: PCT/FR2022/050749
§ 371 (c)(1),
(2) Date: Oct. 24, 2023

(87) PCT Pub. No.: WO2022/229545
PCT Pub. Date: Nov. 3, 2022

(65) Prior Publication Data

US 2024/0235736 A1 Jul. 11, 2024

(30) Foreign Application Priority Data

Apr. 27, 2021 (FR) ...................................... 2104361

(51) Int. Cl.
*H04L 1/00* (2006.01)
*H03M 13/00* (2006.01)
(Continued)

(52) U.S. Cl.
CPC .......... *H04L 1/0068* (2013.01); *H03M 13/25* (2013.01); *H03M 13/6325* (2013.01)

(58) Field of Classification Search
CPC ... H04L 1/0068; H04L 1/0058; H04L 1/0041; H03M 13/25; H03M 13/6325;
(Continued)

(56) References Cited

U.S. PATENT DOCUMENTS 11,411,796 B1 * 8/2022 Gulati ................... H04L 1/0058
12,166,594 B2 * 12/2024 Lei ........................ H04L 1/1896
(Continued)

OTHER PUBLICATIONS

International Search Report dated Sep. 13, 2022 for corresponding International Application No. PCT/FR2022/050749, filed Apr. 21, 2022.

(Continued)

*Primary Examiner* — Harry H Kim
(74) *Attorney, Agent, or Firm* — David D. Brush; Westman, Champlin & Koehler, P.A.

(57) ABSTRACT

A data transmission method implemented by a first item of telecommunication equipment transmitting to a second item of telecommunication equipment. The method includes: encoding input data by using an encoder; and puncturing data after encoding; modulating with mapping of the data, after puncturing, on one of M symbols of a constellation having order M, where M=$2^q$, q>=2. The method is such that the puncturing of the data differs according to the position of the symbol in the constellation on which these data are mapped after puncturing.

20 Claims, 4 Drawing Sheets

Figure 4:
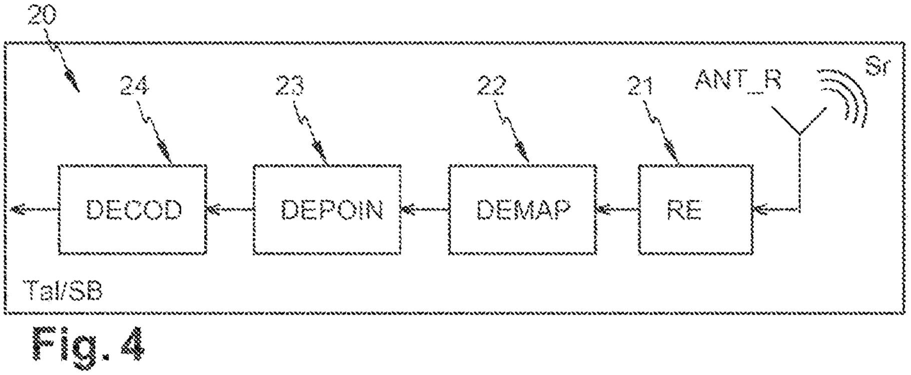

(51) Int. Cl.
*H03M 13/25* (2006.01)
*H03M 13/35* (2006.01)

(58) Field of Classification Search
CPC ............. H03M 13/255; H03M 13/256; H03M 13/356; H03M 13/6362
See application file for complete search history.

(56) References Cited

U.S. PATENT DOCUMENTS

| | | | | |
|---|---|---|---|---|
| 12,407,469 | B2 * | 9/2025 | Liu | H04L 5/0007 |
| 2003/0145273 | A1 * | 7/2003 | Hofman | H04L 1/0068 714/790 |
| 2005/0172202 | A1 * | 8/2005 | Eroz | H03M 13/6312 714/755 |
| 2008/0010582 | A1 * | 1/2008 | Nieto | H04L 1/0068 714/790 |
| 2017/0244588 | A1 * | 8/2017 | Ling | H04L 1/005 |
| 2018/0091225 | A1 * | 3/2018 | Wang | H04B 10/612 |
| 2018/0337813 | A1 * | 11/2018 | Park | H04L 27/2627 |
| 2024/0106473 | A1 * | 3/2024 | Wong | H04L 1/08 |
| 2024/0235736 | A1 * | 7/2024 | Siaud | H03M 13/25 |
| 2025/0016787 | A1 * | 1/2025 | Dinan | H04L 27/0006 |

OTHER PUBLICATIONS

Written Opinion of the International Searching Authority dated Sep. 13, 2022 for corresponding International Application No. PCT/FR2022/050749, filed Apr. 21, 2022.

English translation of the Written Opinion of the International Searching Authority dated Sep. 13, 2022 for corresponding International Application No. PCT/FR2022/050749, filed Apr. 21, 2022.

Notice of Allowance and Fee(s) Due for U.S. Appl. No. 18/557,161, filed Nov. 25, 2025, 13 pages.

Corrected Notice of Allowability for U.S. Appl. No. 18/557,161, Feb. 19, 2026, 2 pages.

* cited by examiner

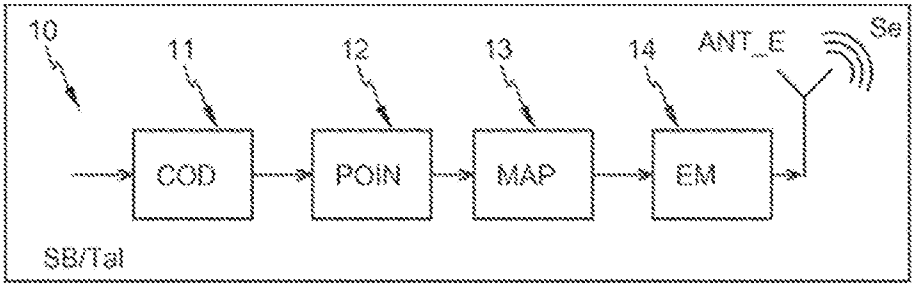
Fig. 1
| Symbol index | Pure binary cod. (4bits) $b_3$ | $b_2$ | $b_1$ | $b_0$ | Grey Cod. (4bits) $G_3$ | $G_2$ | $G_1$ | $G_0$ |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 0 | 0 | 1 | 1 |
| 3 | 0 | 0 | 1 | 1 | 0 | 0 | 1 | 0 |
| 4 | 0 | 1 | 0 | 0 | 0 | 1 | 1 | 0 |
| 5 | 0 | 1 | 0 | 1 | 0 | 1 | 1 | 1 |
| 6 | 0 | 1 | 1 | 0 | 0 | 1 | 0 | 1 |
| 7 | 0 | 1 | 1 | 1 | 0 | 1 | 0 | 0 |
| 8 | 1 | 0 | 0 | 0 | 1 | 1 | 0 | 0 |
| 9 | 1 | 0 | 0 | 1 | 1 | 1 | 0 | 1 |
| 10 | 1 | 0 | 1 | 0 | 1 | 1 | 1 | 1 |
| ... | ... | ... | ... | ... | ... | ... | ... | ... |
| 14 | 1 | 1 | 1 | 0 | 1 | 0 | 0 | 1 |
| 15 | 1 | 1 | 1 | 1 | 1 | 0 | 0 | 0 |
Cod.2 bits
Cod.3 bits
Cod.4 bits
Fig. 2
Fig. 3
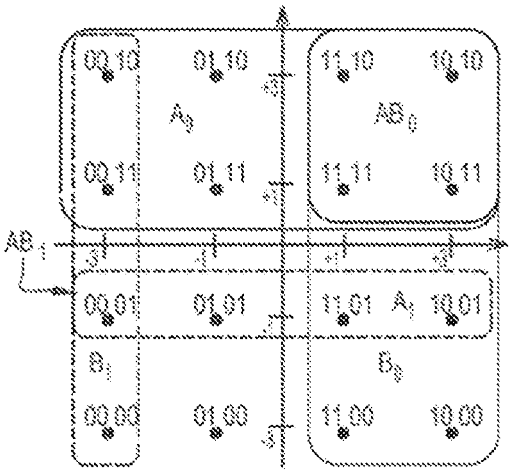

DATA TRANSMISSION METHOD WITH VARIABLE PUNCTURING BETWEEN CONSTELLATION SYMBOLS ACCORDING TO THE LOCATION THEREOF

CROSS-REFERENCE TO RELATED APPLICATIONS

This Application is a Section 371 National Stage Application of International Application No. PCT/FR2022/050749, filed Apr. 21, 2022, which is incorporated by reference in its entirety and published as WO 2022/229545 A1 on Nov. 3, 2022, not in English.

FIELD OF THE INVENTION

The present invention relates to the field of telecommunications. Within this field, the invention relates more particularly to methods for transmitting data from a first telecommunications equipment to a second equipment with puncturing of the data after coding and before transmission by the antenna. It is applicable in particular to portable telecommunications devices that establish communication via a base station or an access point.

PRIOR ART

A radio access network generally consists of multiple base stations or access points that allow a user equipment (UE), also referred to subsequently as terminal or UE, to access a telecommunications network and to establish communication in order to exchange data.

The communication transmission medium is commonly called a transmission channel or propagation channel, originally with reference to an airborne channel and, by extension, with reference to any channel. Wireless systems have what is called an RF transmission interface when they involve a telecommunications system with airborne transmission of a signal belonging to a radio band (for example 5G NR, 4G, GSM, UMTS, IEEE 802.11x, IEEE 802.16e, etc.). Among these systems, a distinction is drawn between cellular access systems that are also said to be mobile, specified more particularly by the 3GPP, and originally non-mobile systems that comprise those based on a Wi-Fi standard specified by the IEEE.

The transmitted data may experience disturbances due to interference introduced by the transmission channel and/or due to noise sources.

To combat disturbances, it is known to protect the transmitted data with a certain level of protection. One widely known and used technique thus consists in adding redundancy to the data by way of an encoder, sometimes called a channel encoder.

However, adding redundancy goes against the useful data rate able to be transmitted between two equipments. In addition, the coding rate of the channel encoder may have to meet certain constraints, for example be stipulated in a telecommunications standard published by a group, for example the 3GPP, the IEEE. In some cases, puncturing has to be implemented after coding in order to adapt the rate.

SUMMARY OF THE INVENTION

The invention proposes a communication method with the purpose of improving the protection of transmitted data.

One subject of the invention is a method, implemented by a first equipment, for transmitting data to a second telecommunications equipment, comprising:

coding input data by way of an encoder, puncturing the data after coding, modulation, with mapping of the data after puncturing onto a symbol from among M symbols of a constellation of order M, $M=2^q$ $q>=2$, and the method is such that the puncturing of the data is different depending on the position of the symbol in the constellation onto which these data are mapped after puncturing.

Another subject of the invention is a telecommunications equipment intended to communicate with a second equipment. The equipment comprises:

an encoder for coding input data, a puncturer for puncturing the data after coding, a modulator for mapping the data after puncturing onto a symbol from among M symbols of a constellation of order M, $M=2^q$ $q>=2$, and the puncturer being such that the puncturing of the data is different depending on the position of the symbol in the constellation onto which these data are mapped after puncturing.

According to the invention, the input data are coded by one and the same encoder so as to generate a string of undifferentiated bits. The variable protection obtained by puncturing that distinguishes between at least two levels of protection takes into account the position of the symbol in the constellation. In the presence of phase noise, the transmitted symbols experience a phase rotation. And a phase error that exceeds a threshold $\delta\theta$ induces a change of decision region for symbols at the periphery of the constellation during the decoding of these symbols at reception. The method thus makes it possible in particular to increase the protection of complex symbols at the periphery of the constellation and therefore to specifically combat particular noise sources, such as sources of phase noise that more particularly affect these symbols at the periphery. The method thus makes it possible to limit interference due to these noise sources.

According to one embodiment, the data transmission method is such that the position of the symbol is evaluated by computing a metric for evaluating the distance from the symbol to the center of the constellation.

According to this embodiment, computing the distance from the symbol to the center of the constellation gives the possible positions of the symbol on a circle of radius equal to the computed distance. The symbols for which the computed distance is greatest correspond to periphery symbols. These symbols are those that are most sensitive to a phase rotation.

According to one embodiment, the data transmission method is such that the puncturing makes it possible to distinguish between at least two levels of protection associated with symbols positioned at different distances to the center of the constellation.

According to this embodiment, the variable protection makes it possible to distinguish between two sets of symbols for which the data mapped onto these symbols are punctured differently. For example, a group comprises symbols at the periphery. And the data mapped onto these symbols then benefit from greater protection than those mapped onto the other symbols, that is to say they are less punctured.

According to one embodiment, at least one symbol of the constellation comprises at least two bits of different weight and the method is such that the puncturing of the data mapped onto this at least one symbol is different depending on the weight of the bits in this at least one symbol.

According to this embodiment, the puncturing after coding distinguishes between the coded data according to the bits of a symbol of the constellation onto which they are mapped. According to a representation of the constellation along two perpendicular axes that define four quadrants, the most significant bits of a set of bits mapped onto a symbol is, by convention, the one located to the left of the set. However, an $x^2$QAM modulation may be constructed by combining two in-phase and quadrature x-order amplitude modulations, one carried by the axis I and the other by the axis Q in the baseband representation of a digital modulation. In these cases, there is a most significant bit for each set of bits mapped onto a symbol for each x-AM modulation, even if the two sets form a binary code that is mapped globally onto one and the same symbol of the $x^2$QAM modulation. The puncturing applied to the data after coding is such that it makes it possible to distinguish between at least two different levels of protection associated respectively with the data mapped onto bits of different weight of a symbol of the constellation. Thus, in contrast to conventional techniques, the various levels make it possible, according to the invention, to obtain non-uniform protection (UEP, Unequal Protection) within one and the same symbol of the constellation, that is to say that the protection is different between certain bits of one and the same symbol of the constellation.

The invention makes it possible in particular to give better protection to data mapped onto less significant bits compared to more significant bits, be these intermediate-weight or high-weight bits. Thus, by taking advantage of the fact that, between bits of different weight, those of higher weight are more robust than those of lower weight to a decision error during decoding to distinguish between two different levels of protection between these bits of different weight, the method advantageously makes it possible to maintain one and the same data transmission bit rate while at the same time guaranteeing better protection to the transmitted data.

According to one embodiment, the data transmission method is such that each symbol of the constellation comprises at least one most significant bit and one least significant bit and such that the puncturing of the data is different between data mapped onto the most significant bit and data mapped onto the least significant bit of one and the same symbol.

According to this embodiment, the invention makes it possible in particular to give better protection to data mapped onto less significant bits compared to more significant bits.

According to one embodiment, the data transmission method is such that the puncturing difference between data mapped onto one and the same symbol applies for all of the symbols of the constellation.

According to one embodiment, the data transmission method is such that the puncturing difference between data mapped onto one and the same symbol applies only for some of the symbols of the constellation.

According to one embodiment, with the puncturing of the data being in accordance with at least two different levels of protection respectively for data mapped onto bits of different weight of one and the same symbol, the method is such that:

- the puncturing comprises at least one puncturing step comprising a first puncturing matrix the output of which is supplied to a demultiplexing stage having a first and a second output, the second output being supplied to a second puncturing matrix so as to define at least two different levels of protection obtained with the first output of the demultiplexing stage and the output of the second puncturing matrix, respectively.

According to one embodiment, the telecommunications equipment is such that the puncturer comprises:

- an elementary structure comprising a first puncturing matrix the output of which is supplied to a demultiplexing stage having a first and a second output, the second output being supplied to a second puncturing matrix so as to define the at least two different levels of protection obtained with the first output of the demultiplexing stage and the output of the second puncturing matrix, respectively.

According to these above embodiments of the method and of the equipment, the data are punctured after coding by implementing at least two puncturing matrices separated by a demultiplexing stage.

The demultiplexing stage makes it possible to distribute the data at output, that is to say associated with different levels of protection, in order to obtain a defined bit rate on each of these outputs. This embodiment is far less complex than known techniques with multiple encoders in parallel in order to deliver high data rates.

According to one embodiment, the data transmission method is such that any puncturing step, referred to as previous step, is followed by a new puncturing step whose first matrix is common with the second matrix of the previous step, so as to define an additional different level of protection that is obtained with the output of the second puncturing matrix from the new puncturing step.

According to the invention, each addition of a puncturing step makes it possible to obtain a new coding rate different from the previous ones and associated with the new level of protection. This embodiment thus makes it possible to increase the order of puncturing with great simplicity.

According to one embodiment, a puncturing ratio is associated with each puncturing matrix, and the data transmission method is such that levels of protection of the data are changed by modifying the ratio of at least one of the puncturing matrices.

Another subject of the invention is a method for communication between a first equipment and a second telecommunications equipment with reception of a data signal by the second equipment, the data being mapped before transmission onto symbols of a constellation of order M, $M=2^q$ q>=2. The communication method is such that it comprises:

- demodulating the symbols with demapping of the data,
- depuncturing the data after demapping of the data, the puncturing of the data at transmission being different depending on the position of the symbol in the constellation onto which these data are mapped after puncturing,
- decoding the data after depuncturing.

According to one embodiment, each symbol of the constellation comprises at least two bits of different weight and the method is such that the depuncturing of the data takes into account a puncturing at transmission depending on the weight of the bits in a symbol onto which the data are mapped.

Another subject of the invention is a telecommunications equipment intended to communicate with a first equipment, in order to receive a data signal, the data being mapped before transmission onto symbols of a constellation of order M, $M=2^q$ q>=2. The equipment is such that it comprises:

a demodulator for demodulating symbols with demapping of the data, a depuncturer for depuncturing the data after demapping of the data, the puncturing of the data at transmission being different depending on the position of the symbol in the constellation onto which these data are mapped after puncturing, a decoder for decoding the data after depuncturing.

Another subject of the invention is a computer program on an information medium, said program comprising program instructions suitable for implementing a method according to the invention when said program is loaded and executed in a telecommunications equipment.

Another subject of the invention is an information medium comprising program instructions suitable for implementing a method according to the invention when said program is loaded and executed in a telecommunications equipment.

Another subject of the invention is a digital signal comprising data transmitted by a first equipment to a second equipment, the transmitted data being mapped onto symbols of a constellation, the data having been punctured differently before mapping depending on the position of the symbol in the constellation onto which these data are mapped after puncturing.

LIST OF THE FIGURES

Figure 5:
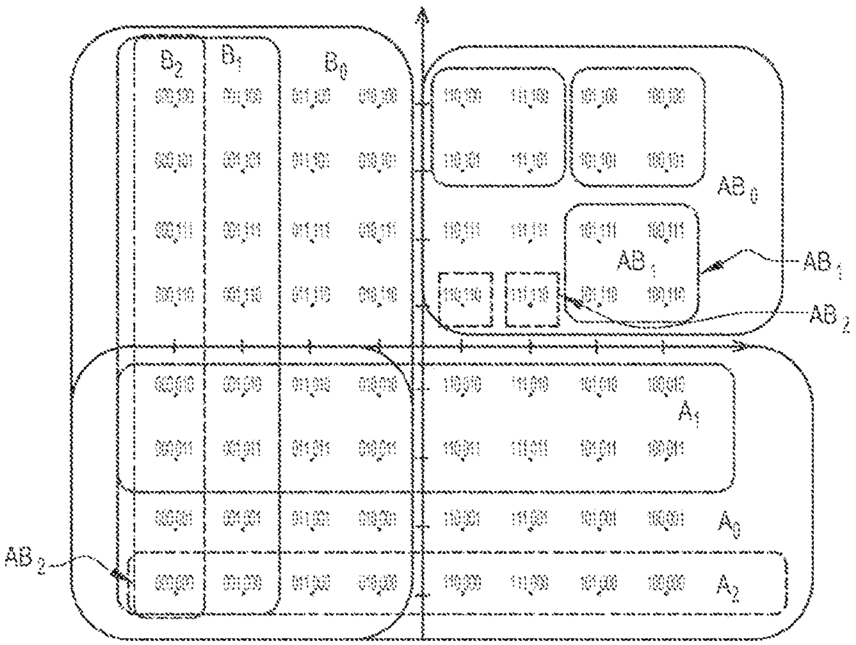
Figure 6:
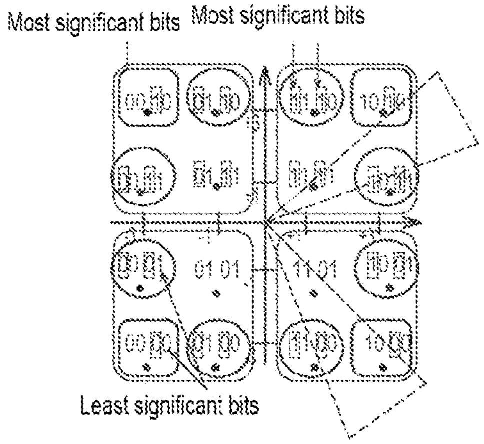
Figure 7:
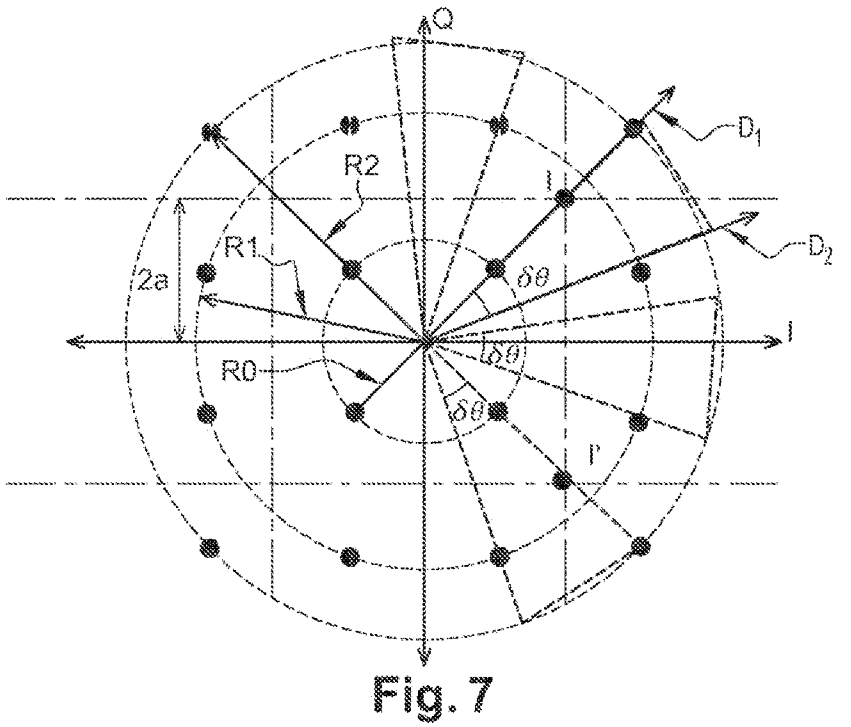
Figure 8:
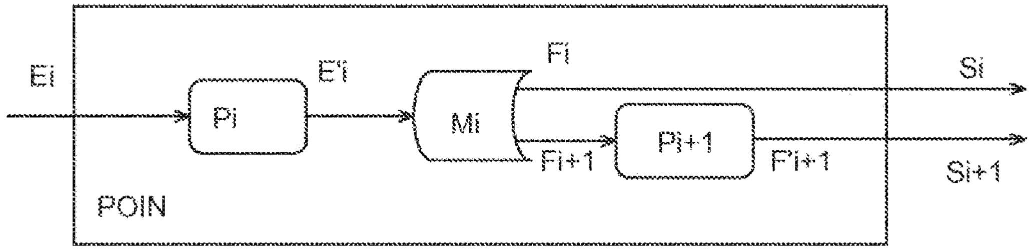
Figure 9:
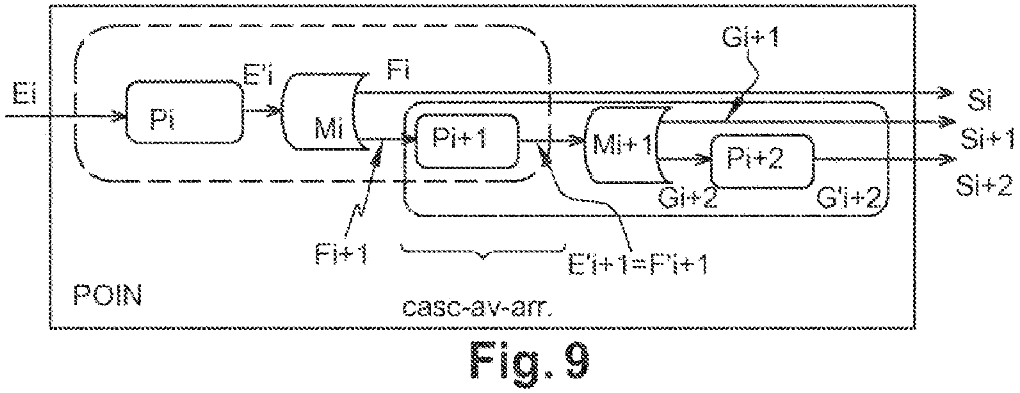
Figure 10:
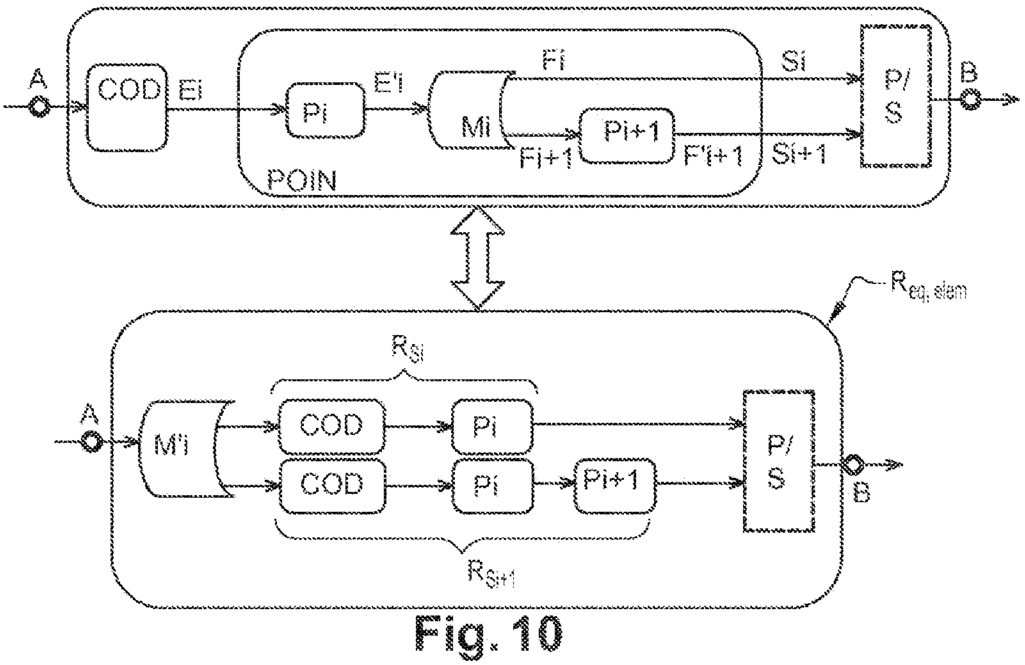
Figure 11:
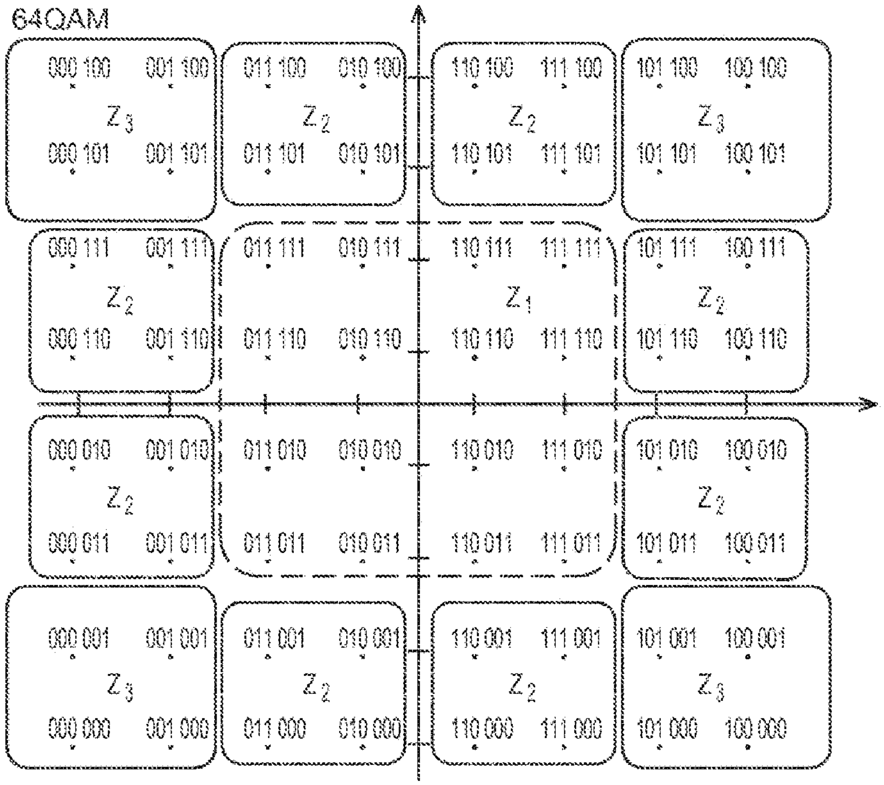

Other features and advantages of the invention will become more clearly apparent on reading the following description of embodiments, which are given by way of simple illustrative and non-limiting examples, and the appended drawings, in which:

FIG. 1 is a diagram of one embodiment of a transmission chain according to the invention, FIG. 2 gives pure binary coding and Gray coding carried out on k=4, k=3 and k=2 bits, FIG. 3 is a representation of a 16-QAM modulation in a reference frame (I,Q) that complies with Gray coding, with illustration of decision regions, FIG. 4 is a diagram of one embodiment of a reception chain according to the invention, FIG. 5 is a representation of a 64-QAM modulation in a reference frame (I,Q) that complies with Gray coding, with illustration of decision regions, FIG. 6 is a representation of a 16-QAM modulation in a reference frame (I,Q) that complies with Gray coding, with identification of the positions furthest from the center and indication of an angle θ, FIG. 7 is a representation of a 16-QAM modulation in a reference frame (I,Q), with illustration of decision regions and with indication of the impact of a rotation by an angle θ on the position of certain symbols, FIG. 8 is a diagram of one embodiment of the elementary structure of the puncturer according to the invention, connected at the output of the encoder so as to obtain two levels of protection, FIG. 9 is a diagram of one embodiment of a cascade arrangement of the elementary structure of the puncturer according to the invention so as to obtain three levels of protection, FIG. 10 is a diagram of one embodiment of the elementary structure of the puncturer according to the invention, connected at the output of the encoder, with an equivalent circuit diagram of this structure with the encoder, FIG. 11 is a representation of a 64-QAM modulation with the distinction between three zones Z1, Z2, Z3 of symbols depending on the distance thereof to the center of the constellation.

DESCRIPTION OF PARTICULAR EMBODIMENTS

The general principle of the invention is based on puncturing data to be transmitted, which makes it possible to distinguish between at least two different levels of protection associated respectively with data mapped onto symbols of a constellation that are located at different positions. In other words, depending on whether a datum is mapped onto a symbol positioned at a certain point of the constellation or onto a symbol positioned at another point of the constellation, then it does not benefit from the same puncturing ratio. The difference in level of protection between data mapped onto different symbols of the constellation is implemented according to the invention for all symbols or for only certain symbols of one and the same constellation associated with a digital modulation.

Puncturing the data may also make it possible to distinguish between at least two other different levels of protection associated respectively with data mapped onto bits of different weight of the symbols of the constellation. In other words, within one and the same symbol of the constellation, depending on whether a datum is mapped onto a most significant bit or onto a least significant bit, then it might not benefit from the same puncturing ratio. The difference in level of protection between data mapped onto one and the same symbol may be implemented according to the invention for all symbols or for only one symbol or certain symbols of the constellation.

FIG. 1 is a diagram of one embodiment of a transmission chain for implementing a method according to the invention. This transmission chain forms part of a telecommunications equipment, which may be either a base station SB or a terminal Tal, such as a smartphone. The chain comprises at least a channel encoder COD, a puncturer POIN and a modulator MAP.

The data transmission method 10 is implemented by the equipment SB/Tal. The method comprises at least coding 11 the input data, puncturing 12 the data after coding, modulation 13, with mapping of the data after puncturing onto a symbol from among M symbols of a constellation of order $M=2^q$, $q \geq 2$, each symbol of the constellation comprising at least two bits of different weight from among q bits. M, q are integers.

The method is such that, for at least one of the M symbols, the puncturing of the data is different depending on the location thereof in the constellation. According to one embodiment, the puncturing of the data is also different depending on the weight of the bits in the symbol onto which these data are mapped.

The transmission 14 of the data after mapping is to another telecommunications equipment, which may be either a terminal or a base station.

The channel encoder COD codes 11 input binary data coming from an information source, which may be either a microphone of a mobile terminal or a local or remote application such as a short message (SMS) application or a multimedia content transmission application. The encoder introduces binary redundancy into the input data with a coding rate $R_i$ so as to output binary data with a certain data rate.

The puncturer POIN punctures 12 the data after channel coding. The data are punctured after coding by implementing multiple puncturing matrices with a demultiplexer between two matrices. The puncturing makes it possible to increase the useful data rate of the information for a fixed bit rate.

The modulator MAP modulates 13 the data after puncturing so as to generate, at output, complex modulated symbols associated with a modulation.

The transmitter EM transmits the data after modulation via a transmit antenna ANT_E in the form of a signal Se. The signal transmitted by the antenna ANT_E generally results from the modulation of what is known as an RF (Radio Frequency) carrier by the modulating signal carrying the data. Other processing operations may of course take place in the chain before or after each of the processing operations illustrated by FIG. 1.

The coded data are arranged into a block of binary data and the modulation performed by the modulator MAP maps these binary data onto the symbols of a constellation so as to construct the signal involved in the modulation of the RF carrier. The mapping of the data may comply with what is known as Gray coding.

The modulating signal of the RF carrier described in baseband thus carries the information to be transmitted and is represented in the form of complex symbols that are distributed in the plane (I,Q) onto which the data have been mapped.

Each symbol of the constellation comprises at least one most significant bit and one least significant bit. The modulator MAP maps the data onto a symbol from among M symbols of a constellation of order M, M≥4 while complying with the constraint that data mapped onto at least two different symbols located at different positions in the constellation have been punctured differently.

According to one embodiment, the modulator MAP maps the data onto a symbol, while also complying with the constraint that data mapped onto the most significant bit and data mapped onto the least significant bit of one and the same symbol have been punctured differently.

The mapping thus covers what is called a binary-to-symbol coding operation, which may be described as a transformation of a binary set $\{b_{k-1}, b_{k-2}, \ldots, b_0\}$ into a symbol $S_c$ of the constellation. The transformation makes it possible to construct M-ary symbols with a binary representation of k=log 2(M) bits, $\{b_{k-1}, b_{k-2}, \ldots, b_0\}$, corresponding to a binary word with $M=2^k$. According to one implementation, the M-ary symbols of the constellation take their value from the space of the relative integers Z consisting of M elements taken from the alphabet A={±1, ±3, . . . ±(2p+1), . . . ± (M−1)}, in accordance with NRZ coding, which has the advantage of being more favorable for transmission. k is an integer.

The transformation generally complies with Gray coding and a specific combination of bits is assigned to each relative integer of the alphabet A. Gray coding is deduced from what is known as pure binary coding. Pure binary coding is based on addition and multiplication operations in the Galois field formed by the integers {0,1}, where the addition corresponds to the 'Exclusive OR' logic operation and the multiplication corresponds to the 'AND' logic operation. The increment in the M-ary alphabet by a relative number (2p+1) to 2(p+1)+1 is carried out by adding (exclusive OR addition (⊕)) a least significant bit equal to 1 to the current binary codeword so as to generate the new binary codeword associated with the symbol 2(p+1)+1. p is an integer.

The most significant bit (MSB or $b_{k-1}$) is the bit, in a given binary representation, having the greatest weight or the greatest position (the one on the left in the usual positional notation); it is the bit that is most robust to state transitions from one symbol to another. The least significant bit (LSB) is the bit, in a given binary representation, having the smallest weight or the smallest position (the one on the right in the usual positional notation). It corresponds to the elementary unit of variation (of state) of a symbol. This concept of bit weight in a symbol refers to the mode of construction of pure binary coding in which robustness to state transitions increases with the weight of the bit in each codeword, that is to say with its position in the codeword.

Gray coding is specific coding derived from pure binary coding that modifies two successive binary codewords by just one bit (a codeword is the binary representation of the M-ary symbol). This Gray code minimizes transition errors from one codeword to another when the state index (index of the M-ary symbol) is incremented by 1. The change from pure binary coding to Gray coding is made by performing an Exclusive OR operation (⊕) on the bits of a pure binary codeword.

Using $b_n$ ($b_0$=LSB, least significant bit) to designate any bit in pure binary code and using $G_n$ to designate the bit sought in Gray code at position n, for a given codeword, the bit $G_n$ following Gray coding is obtained as follows:

$$G_n=b_n \oplus b_{n+1}; G_{MSB}=b_{MSB} \quad (1)$$

where $b_n$ and $b_{n+1}$ are two bits in the same codeword of pure binary coding at the positions n and n+1 and of weight n and n+1, respectively. The most significant bit is the bit furthest to the left in the representation of pure binary coding.

At reception, the Gray decoding to regenerate a pure binary code is performed by carrying out the following operation:

$$b_n=G_n \oplus b_{n+1} \quad (2)$$

The weight of the bits in a symbol is hierarchized according to its robustness to a binary-to-symbol decoding error.

[Table 1] and [Table 2] in the Appendix give an illustration of pure binary coding and of Gray coding for M=16 (and k=4) and M=8 (and k=3), respectively. The most significant bits remain unchanged in pure binary coding and in Gray coding for the indices of symbols varying from 0 to 7 and from 8 to 15, thereby giving them greater robustness during a transition from one state to another.

The pure binary coding and Gray coding operations carried out on k=4, k=3 and k=2 bits may be deduced from one another through their mode of construction, since the weight of the bits decreases from left to right as illustrated in FIG. 2. In other words, the hierarchization and the interleaving of the coding according to the number of bits per symbol appears explicitly in the construction of the codewords according to the weight of the bit and its position in the codeword.

What is known as an $M\text{-QAM}=2^{2k}=N^2$ modulation may be constructed by combining two in-phase and quadrature amplitude modulations of order $N=2^k$, one carried by the axis I and the other by the axis Q in the baseband representation of a modulation. For each of the two modulations, the abscissa $S_{n,i}$ and ordinate $S_{n,q}$ of each symbol $S_n$ take their values from the alphabet A={±1, ±3, . . . ±(2p+1), . . . ±(N−1)}.

$$S_n=S_{n,i}+j\,S_{n,q} \quad (3)$$

The combination of the two modulations generates the M-state QAM modulation to which a constellation with M symbols $S_m$ corresponds. The complex symbols of the signal modulating the RF carrier are each formed of 2×log 2(N) bits $\{b_{2k-1}, b_{2k-2}, \ldots b_k, b_{k-1}, \ldots b_0\}$, where $\{b_{2k-1}, b_{2k-2}, \ldots b_k\}$ describes the binary coding of the in-phase amplitude modulation and $\{b_{k-1}, b_{k-2}, \ldots b_0\}$ describes the binary coding of the quadrature amplitude modulation, as given in [Table 3] in the Appendix. The symbols are distributed in the plane I, Q such that the adjacent symbols differ only by one bit in accordance with the Gray coding according to a position determined with respect to the symbol of index 0, as illustrated by FIG. 3 for a 16-QAM modulation. According to this construction, the channels I and Q are modulated and demodulated independently.

Concept of Decision Regions at Reception

FIG. 4 is a diagram of one embodiment of a reception chain for implementing a communication method according to the invention. This reception chain forms part of a telecommunications equipment, which may be either a terminal Tal, such as a smartphone, or a base station SB. This chain performs at least the inverse functions to those at transmission that are illustrated by FIG. 1. This reception chain comprises at least a demodulator DEMAP, a depuncturer DEPOIN and a decoder DECOD.

The data signal Sr received 21 by a receiver RE via the receive antenna ANT_R corresponds to the signal Se transmitted by the transmit antenna ANT_E after transmission via the propagation channel: the data carried by the transmitted signal having been mapped before transmission onto symbols of a constellation of order M, $M=2^q$ q>=2, each symbol of the constellation comprising at least two bits of different weight, and the puncturing of the data before mapping being different depending on the location of the symbol and possibly depending on the weight of the bits in the symbol onto which the data are mapped.

The communication method 20 comprises at least demodulating 22 the symbols with demapping of the data, depuncturing 23 the data after demapping of the data, decoding 24 the data after depuncturing by way of the equipment Tal/SB.

The demodulator DEMAP performs a demapping function 22 inverse to that implemented by the modulator MAP.

The depuncturer DEPOIN performs a depuncturing function 23 inverse to that implemented by the puncturer POIN in the sense that it makes it possible to restore the punctured bits.

The decoder DECOD performs a decoding function 24 inverse to the coding function implemented by the encoder COD.

The demodulation 22 implemented by the demodulator DEMAP aims to determine the most probable transmitted symbol based on a received point. The received points are marred by thermal noise but also by noise of various origins such as phase noise, which generate a variation in the position of the complex symbols in the constellation through phase rotation. During this demodulation operation 22, the method performs for example a maximum likelihood detection. According to this mode of implementation, the method determines the symbol closest to the observation (received symbol) according to a criterion of Euclidean distance between the symbols of the constellation and the received symbol.

The decision-making on the closest symbol may be illustrated with the concept of decision regions. Such decision regions are shown schematically in FIG. 3 in the case of a distribution of the symbols in the constellation that complies with the Gray coding (two adjacent symbols differ by only one bit).

The decision region associated with a symbol, which is complex or non-complex, as a whole is the intersection of the decision regions attached to each bit forming the symbol, in the knowledge that this symbol is positioned in the constellation according to its index specified during the binary coding operation.

According to the illustration of FIG. 3, the rectangle A0 represents the decision region associated with the most significant bits for the quadrature 4-AM amplitude modulation, that is to say along the axis Q. In other words, in this region, the most significant bit of each of the symbols of this modulation is at one, while all symbols outside this region have their most significant bit at zero. The rectangle B0 represents the decision region associated with the most significant bits for the in-phase 4-AM amplitude modulation, that is to say along the axis I. The intersection of the two rectangles A0 and B0, that is to say the region (AB0), provides the decision region for the most significant bits of the 16-QAM modulation, each symbol of which has two most significant bits relating to each of the 4-AM modulations. This decision region AB0 is the one in which the two most significant bits of a 16-QAM symbol are at one according to this construction with two 4-AM modulations.

The rectangle A1 represents the decision region associated with the least significant bit for the 4-AM amplitude modulation along the axis Q.

The rectangle B1 represents the decision region associated with the least significant bit for the 4-AM amplitude modulation along the axis I.

The intersection of the two rectangles A1 and B1, that is to say the region AB1, provides the decision region for the least significant bits of the 16-QAM modulation according to this construction with two 4-AM modulations.

During digital demodulation, the estimated symbol meets the maximum likelihood criterion, such that the decision regions under consideration for each symbol correspond to the intersection of the decision regions of the bits forming the symbol. These intersections correspond to those of the least significant bits.

The demodulation 22 according to the invention, which performs binary-to-symbol decoding, makes it possible to weight the estimation error for the transmitted bits associated with the variation of the decision regions according to the weight and possibly the position of the bit in the constellation.

[Table 4] in the Appendix and FIG. 5 relate to a 64-QAM. According to the illustrated construction, the 64-QAM modulation is generated by combining, in-phase and quadrature, two eight-state 8-AM amplitude modulations carried respectively by the channels I and Q. Each 8-AM amplitude modulation is characterized by three bits of different weight (or levels) associated with their positions during binary coding. This results in three different types of zones for delimiting the decision regions of the bits transmitted during the binary-to-symbol decoding operation.

Each 64-QAM symbol is formed of 6 bits $\{b_{k-1}, b_{k-2}, \ldots b_0\}$ with k=6. The first three bits describe the in-phase 8-AM amplitude modulation and the last three bits describe the quadrature 8-AM amplitude modulation.

In FIG. 5, the decision regions $AB_0$ associated with the most significant bits MSB of position $\{G_5, G_2\}$ result from the intersection of the regions of type $A_0$ and $B_0$.

The dashed square zones $AB_1$ represent the delimitation of the decision region for the bits of intermediate weight corresponding to the bits at position $[G_4, G_1]$. This is the intersection of the two decision regions $A_1$ and $B_1$ associated with the bits of intermediate weight for the in-phase and quadrature 8-AM modulations.

The intersection of the decision regions of type $A_2$ and $B_2$, that is to say the decision region $AB_2$, provides the decision region for the least significant bits LSB of the 64-QAM modulation. These regions of type $AB_2$ coincide with the decision regions associated with the complex symbol $S_m$ of the 64-QAM modulation.

FIGS. 6 and 7 show a 16-QAM. The periphery symbols are shown surrounded by a square in FIG. 6; they are those whose abscissas and ordinates are the largest in terms of absolute value. In the presence of phase noise, the transmitted symbols experience a phase rotation. A phase error that exceeds a certain threshold induces a change of decision region for symbols at the periphery of the constellation during the decoding of these symbols at reception. This change therefore induces an error when making a decision on the transmitted symbol that occurs during the digital demodulation.

Let us consider a phase rotation $\delta\theta$ corresponding to the angle between, on the one hand, the median $D_1$ passing through the center O of the constellation and connecting two symbols of the constellation whose distances are equal on the in-phase and quadrature components of the digital modulation and, on the other hand, the straight line $D_2$ starting from the center O of the constellation and passing through the closest adjacent symbol and corresponding to an adjacent decision region.

The symbols surrounded by a square in FIG. 6 are the symbols most sensitive to the phase rotation $\delta\theta$; they change decision region after the rotation. These symbols are located on a circle of radius $R_2$:

$$R2=3\sqrt{2}a \tag{4}$$

where 2a is the width of a decision region.

One and the same phase rotation $\delta\theta$ leads to indeterminacy on the decision region for the symbols surrounded by a circle and located at an intermediate distance R1 from the center O of the constellation. Indeed, the rotation, with an accuracy of the order of 9%, positions one of these received symbols at the intersection of the straight lines delimiting four decision regions (points I and I' in FIG. 7). This positioning may therefore generate indeterminacy at reception on the transmitted symbol. The radius R1 is given by:

$$R1=\sqrt{10}a \tag{5}$$

This same rotation $\delta\theta$ on the symbols closest to the center of the constellation and located at a distance R0 from the center of the constellation (R0=$\sqrt{2}$ a) does not lead to a change of decision region, as illustrated in FIG. 7.

Thus, according to the invention, the data mapped onto a symbol located at the distance R2, surrounded by a square in FIG. 6, are for example less punctured than the data mapped onto a symbol positioned at the distance R1, surrounded by a circle in FIG. 6, which themselves may be less punctured than the data mapped onto a symbol located at the distance R0 from the center of the constellation.

Elementary Structure of the Puncturer

One embodiment of a puncturer is shown in FIG. 8.

According to this embodiment, the puncturer POIN comprises an elementary structure. The elementary structure delimited by the broken line has an input Ei and two outputs Si and Si+1. It consists of a first puncturing module Pi with one input Ei and one output E'i, followed by a demultiplexer Mi [1:2] (one input E'i to two outputs Fi and Fi+1) whose output branch Fi+1 is connected to a second puncturing module Pi+1. The input of the second puncturing module Pi+1 is Fi+1, and its output is denoted F'i+1.

The demultiplexer Mi is intended to distribute the data intended for the branches Si and Si+1 on its two outputs Fi and Fi+1 such that the output data rates are controlled on each of the branches. Each puncturing module Pi, Pi+1 implements a puncturing matrix, denoted Pi, Pi+1 like the corresponding puncturing module, the size of which depends on the puncturing ratio of the module.

The puncturer POIN then comprises two outputs Si and Si+1 having levels of protection that may be different from one another depending on the parameterization of the puncturing matrix Pi+1, that is to say at most two different levels of protection. If this puncturing matrix Pi+1 contains at least one zero, then the two outputs Si and Si+1 have levels of protection that are different from one another.

According to one determined choice, the data on the output Si that corresponds to the output Fi of the demultiplexer Mi are mapped onto a symbol at a distance R2. According to this same choice, the data on the output Si+1 that corresponds to the output F'i+1 of the second puncturing module Pi+1 are mapped onto a symbol at a distance R1<R2. Thus, according to this embodiment of the invention, the input data Ei are punctured differently depending on whether they are mapped onto a symbol of the constellation at a distance R2 or a distance R1 from the center of the constellation.

The matrix Pi leads to uniform puncturing on the two outputs Si and Si+1 when the matrix Pi+1 is inactive, that is to say is formed of only "ones".

According to one mode of implementation, the above puncturer with two outputs, therefore with at least one elementary structure, may make it possible to obtain more than two levels of protection. In particular, a first parameterization of the puncturing matrix Pi+1 makes it possible to obtain two levels of protection on the two outputs Si and Si+1, and a second parameterization of the puncturing matrix Pi+1 makes it possible to obtain two other levels of protection on the two outputs Si and Si+1. Thus, by modifying only the parameterization of the puncturing matrix Pi+1, it is possible to obtain different pairs of levels of protection on the two outputs Si and Si+1, whether or not the matrix Pi is active.

According to one embodiment, the telecommunications equipment SB/Tal intended to communicate with a second equipment Tal/SB comprises a puncturer POIN with the elementary structure described above. The data transmission method 10 implemented by this embodiment of the equipment SB/Tal is such that the puncturing 3 of the data is in accordance with at least two different levels of protection respectively for data mapped onto different symbols located at different positions in the constellation. And more particularly, the method is such that the puncturing 3 comprises at least one puncturing step comprising a first puncturing matrix the output of which is supplied to a demultiplexing stage having a first and a second output, the second output being supplied to a second puncturing matrix so as to define the at least two different levels of protection obtained with the first output of the demultiplexing stage and the output of the second puncturing matrix, respectively.

According to another embodiment illustrated by FIG. 9, the puncturer POIN comprises a first elementary structure followed by at least one second elementary structure cascaded in an interleaved manner, called front-to-rear cascade case-av-arr. According to this embodiment, the first puncturing module of the second structure, that is to say the matrix Pi+1, is common with the second puncturing module of the first structure. The puncturer POIN then comprises three outputs Si, Si+1, Si+2 having levels of protection that may be different from one another, that is to say at most three different levels of protection. If the puncturing matrix Pi+2, that is to say the distinctive added matrix, contains at least one zero, then the two outputs Si+1 and Si+2 have levels of protection that are different from one another. If the puncturing matrix Pi+1 contains at least one zero, then the output Si has a level of protection that is different from the level of protection of the output Si+1, on the one hand, and from the level of protection of the output Si+2, on the other hand.

The addition of a new elementary structure, delimited by a broken line in FIG. 9, makes it possible to obtain an additional level of protection that may be separate from the other levels of protection depending on the parameterization of the non-common puncturing matrix, Pi+2, of the added structure.

The front-to-rear cascade architecture with the use of the above puncturing module makes it possible to increase the puncturing order (that is to say the number of puncturing levels) with a great deal of simplicity and flexibility. An additional puncturing level is obtained by adding a single stage of the elementary structure and parameterizing the puncturer according to the protection under consideration.

The elementary structure in a front-to-rear cascade arrangement makes it possible to simplify the adaptation of the puncturing according to the order M of the modulation.

According to one embodiment, the telecommunications equipment SB/Tal intended to communicate with another equipment Tal/SB comprises a puncturer POIN with at least two elementary structures in a front-to-rear cascade arrangement described above. Each elementary structure is associated with a puncturing step of the transmission method.

The data transmission method 10 implemented by this embodiment of the equipment SB/Tal is such that it comprises a first puncturing step comprising a first puncturing matrix the output of which is supplied to a demultiplexing stage having a first and a second output, the second output being supplied to a second puncturing matrix so as to define the at least two different levels of protection obtained with the first output of the demultiplexing stage and the output of the second puncturing matrix, respectively. And the method is such that any puncturing step, referred to as previous step, therefore in particular the first puncturing step, is followed by a new puncturing step whose first matrix is common with the second matrix of the previous step, so as to define an additional different level of protection that is obtained with the output of the second puncturing matrix from the new puncturing step. Thus, when the puncturer comprises two elementary structures in front-to-rear cascade, the transmission method that is implemented comprises two puncturing steps. Each additional elementary structure of the puncturer adds a puncturing step to the method that is implemented.

A puncturer with four outputs, therefore with at least three elementary structures in front-to-rear cascade, may make it possible to give separate protection to the data depending on the weight or position of the bit onto which these punctured data are mapped. This protection depending on the position of the bit is in addition to separate protection depending on the position of the symbol. In particular, two levels of protection may be reserved for the data mapped onto a periphery symbol of the constellation, therefore depending on the position of the symbol, with a distinction between these two levels depending on whether the data are mapped onto a most significant bit or a least significant bit of this symbol.

The invention thus makes it possible to jointly differentiate the protection according to the position of the symbol in the constellation and within the symbol by taking into account the position of the bit in the codeword.

In order to give separate protection to the punctured data depending on the position of the symbol onto which these data are mapped, the parameterization of the front-to-rear cascade structure of the puncturer may take into account a metric for evaluating the distance from the complex symbol to the center of the constellation.

According to one embodiment of the invention, the parameterization of the puncturer determines the number of elementary front-to-rear cascade structures to distinguish between levels of protection between the symbols depending on their position in the constellation evaluated by the metric.

Determination of Puncturing Matrices

The encoder COD carries out for example convolutional channel coding or rate-compatible LDPC coding $R_i$, the code being called the mother rate-compatible code $R_i$.

Considering the elementary structure of the puncturer illustrated by FIG. 8, the puncturing ratio $R_{pi}$ greater than or equal to 1 designates the ratio between the number of bits at the input of the puncturing module Pi and the number of bits at the output of this module Pi. This ratio is deduced from the puncturing matrix Pi, which specifies the number and the position of the bits to be punctured and therefore not transmitted by the puncturing module Pi. By convention, by virtue of the decoding downstream of the depuncturing, the punctured bits are designated by the integer '0' in the matrix Pi, and the transmitted bits are designated by the integer '1' in this matrix Pi. The puncturing ratio $R_{pi}$ is written:

$$R_{pi}=N_{in,i}/N_{out,i}\geq 1 \tag{6}$$

where $N_{in,i}$ designates the number of bits at the input of the puncturing module Pi and $N_{out,i}$ designates the number of bits at the output of this module Pi. According to one simple implementation, $N_{in,i}$ represents the total number of elements of the puncturing matrix Pi and $N_{out,i}$ represents the number of elements at '1' in the puncturing matrix Pi.

More generally, the puncturing matrix Pi comprises a number of rows that is a multiple of the inverse of the rate $R_i$ of the mother code. The number of columns is a multiple of the numerator of the desired code rate $R_{si}$ after puncturing, such that:

$$R_{si}=R_i\times N_{in,i}/N_{out,i} \tag{7}$$

$R_{si}$ is therefore the channel coding rate on the output Si branch i after puncturing by the puncturing module Pi.

Determining the channel coding rate on the branch i thus makes it possible to determine at least one puncturing matrix that makes it possible to obtain the ratio $R_{pi}$.

The demultiplexing performed by the demultiplexer Mi consists in adjusting the number of bits on each of the output branches Si and Si+1, taking into account the puncturing matrices Pi and Pi+1. This adjustment is determined step by step, according to the constraints of optimizing the input and output data rates of the puncturer.

According to one embodiment of the invention, the bit rate is set to be identical on each of the output branches of the elementary structure: $D_{si}=D_{si}+1=D_b/n_b$, where $n_b$ is the number of branches at the output of the puncturer, $n_b=2$ according to the example detailed below.

The demultiplexer Mi distributes the bits over the branches Fi and Fi+1, taking into account the ratio $R_{pi+1}$ of the puncturing matrix Pi+1. The bit rates at various points of the elementary structure are then computed as follows:

$$D_{si}=D_{si+1}=D_{Fi}=D_{F'i+1}=D_b/2 \quad (8)$$

$$D_{Fi+1}=D_{F'i+1}\times N_{in,i+1}/N_{out,i+1}=D_{F'i+1}\times R_{pi+1}=R_{pi+1}\times D_b/2$$

$$D_{E'i}=D_{Fi+1}+D_{Fi}=(1+R_{pi+1})\times D_b/2 \quad (9)$$

The bit rate $D_{Ei}$ at the output of the channel encoder is expressed as a function of the bit rate at the output of the elementary structure, as follows:

$$D_{Ei}=D_{E'i}\times R_{pi}=R_{pi}\times(1+R_{pi+1})\times D_b/2 \quad (10)$$

Since the puncturing matrix Pi punctures the bits of the input stream uniformly, the only change in its parameterization makes it possible to modify the pair of rates on the two outputs. According to a first parameterization, the puncturing matrix Pi may be formed solely of '1's so as not to perform puncturing on the coded bits at the output of the channel encoder. These bits may for example correspond to the information bits coming from a systematic encoder, which information bits are generally not punctured. According to another parameterization, the puncturing matrix Pi may be used for example to reduce the redundancy associated with certain symbols according to their position in the constellation. Thus, a first parameterization of the puncturing matrix Pi, for example $R_{pi}=1$, gives a pair of levels of protection for all periphery symbols. And a second parameterization, for example $R_{pi}>1$, gives another pair of levels of protection for all symbols apart from periphery symbols. The puncturing module Pi, which uniformly punctures the bits, may thus enable additional puncturing of the data mapped onto the symbols closest to the center O of the constellation.

FIG. 10 gives a diagram of two embodiments of the invention.

According to the first embodiment, the puncturer POIN comprises an elementary structure, such as that already described with reference to FIG. 8. The puncturer punctures the data after coding by an encoder COD. The output data of the puncturer may be represented by two streams corresponding to the two outputs Si and Si+1, or may be represented in the form of a single stream combining the two outputs.

According to the second embodiment, which is equivalent to the first embodiment from a channel coding point of view, the input data are first demultiplexed by a demultiplexer M'i so as to distinguish between two outputs. The first output of the demultiplexer M'i is coded by a first channel encoder COD. The output data of the first channel encoder COD are punctured by a first puncturing module of matrix Pi. The second output of the demultiplexer M'i is coded by a second channel encoder COD, identical to the first channel encoder COD. The output data of the second channel encoder COD are punctured by a second puncturing module of matrix Pi. The data punctured by this second puncturing module of matrix Pi are again punctured by a third puncturing module of matrix Pi+1.

This second embodiment makes it possible to compute the equivalent channel coding rate $R_{eq,elem}$ of the elementary puncturing structure with channel coding, between the input point A and the output point B after placing the two outputs of the puncturer in series.

The equivalent channel coding rate is deduced from equation (10):

$$R_{eq,elem}=R_i\times R_{pi}\times\frac{1+R_{pi+1}}{2} \quad (11)$$

An equivalent puncturing ratio may be defined for the elementary structure:

$$R_{peq,elem}=R_{eq,elem}/R_i=R_{pi}\times\frac{1+R_{pi+1}}{2}$$

The equivalence of the structures of the two embodiments makes it possible to adjust the ratios $R_{pi}$ and $R_{pi+1}$ for a given channel encoder COD with a rate $R_i$ in order to generate a target equivalent channel coding rate for the symbols of the constellation.

The equivalent channel coding rates on the branches Si and Si+1 are given by:

$$R_{si}=R_i\times R_{pi} \text{ and } R_{si+1}=R_i\times R_{pi}\times R_{pi+1} \quad (12)$$

The values of the pair $\{R_{pi}, R_{pi+1}\}$ for a target coding rate $R_{eq,elem}$ are adjusted according to the desired granularity of the data rates.

The equivalence of the structures in the two embodiments illustrated in FIG. 10 illustrates the reduction in complexity provided by the elementary multilevel puncturing structure when it is chosen to parallelize the coding structures in order to limit the coding processing speed associated with each branch. Such a choice to parallelize the coding may be implemented for very high data rate systems, typically for systems operating in the millimeter band or in the THz band. The proposed multilevel puncturing structure makes it possible to reduce complexity of a multilevel channel coding structure at transmission while at the same time ensuring downstream multi-protection binary-to-signal coding.

Puncturer with Two Elementary Structures

For the puncturer illustrated by FIG. 9, that is to say with two elementary structures, and in the case where the three outputs Si, Si+1 and Si+2 have one and the same bit rate, the data rates at various locations may be expressed as follows:

$$D_{Si}=D_{Si+1}=D_{Si+2}=D_{G'i+2}=D_{Gi+1}=D_{Fi}=\frac{D_b}{n_b} \text{ with } n_b=3 \quad (13)$$

$$D_{Gi+2}=D_{G'i+2}\times\frac{N_{in,i+2}}{N_{out,i+2}}=D_{G'i+2}\times R_{pi+2}=R_{pi+2}\times\frac{D_b}{3}$$

$$D_{F'i+1}=D_{Gi+2}+D_{Gi+1}=(1+R_{pi+2})\times\frac{D_b}{3} \quad (14)$$

$$D_{Fi+1}=D_{F'i+1}\times\frac{N_{in,i+1}}{N_{out,i+1}}=D_{F'i+1}\times R_{pi+1}=R_{pi+1}\times(1+R_{pi+2})\times\frac{D_b}{3} \quad (15)$$

$$D_{E'i}=D_{Fi+1}+D_{Fi}=(1+R_{pi+1}\times(1+R_{pi+2}))\frac{D_b}{3}$$

$$D_{Ei}=R_{pi}\times D_{E'i}=R_{pi}(1+R_{pi+1}\times(1+R_{pi+2}))\frac{D_b}{3} \quad (16)$$

The equivalent channel coding rates on each of the three branches are therefore given by:

$$R_{si}=R_i\times R_{pi};R_{si+1}=R_i\times R_{pi}\times R_{pi+1};R_{si+2}=R_i\times R_{pi}\times R_{pi+1}\times R_{pi+2} \quad (17)$$

The overall equivalent channel coding rate is therefore given by:

$$R_{eq}=R_i\times R_{pi}\times\frac{(1+R_{pi+1}\times(1+R_{pi+2}))}{3} \quad (18)$$

The equivalent puncturing ratio for the structure is expressed in the form:

$$R_{peq} = R_{pi} \times \frac{(1 + R_{pi+1} \times (1 + R_{pi+2}))}{3} \quad (19)$$

Puncturer with J Elementary Structures

A puncturer that comprises J elementary structures in front-to-rear cascade provides J+1 outputs. If the bit rate is set to be identical to $$\frac{D_b}{J+1}$$

on each of the outputs, also referred to as branches, then the data rate at the input of each non-uniform demultiplexer is computed step by step, taking into account the puncturing ratio of each puncturing module. The equivalent channel coding rates on each branch are therefore given by:

$$R_{Si} = R_i \times R_{pi};\ R_{Si+1} = R_i \times \prod_{m=1}^{l} R_{pi} \times R_{pi+m} \quad l > 0 \quad (20)$$

$$\text{with } R_{pi+l} = \frac{N_{in,i+1}}{N_{out,i+1}},\ l = \{0, \ldots J+1\}.$$

And the equivalent channel coding rate is given by:

$$R_{eq} = \frac{1}{J+1} \times \sum_{l=0}^{J} R_{Si+l} = R_i \times R_{pi} \frac{1 + \sum_{l=1}^{J} \prod_{m=1}^{l} R_{pi+m}}{J+1} \quad (21)$$

The computation of the data rate $D_{Ei}$ at the input of the puncturer may then be written in the form:

$$D_{Ei} = \frac{R_{eq}}{R_i} \times D_b \quad (22)$$

The equivalent puncturing ratio of the puncturer is then expressed in the form:

$$R_{peq} = \frac{1}{J+1} \times \frac{1}{R_i} \times \sum_{l=0}^{J} R_{Si+l} = R_{pi} \times \frac{1 + \sum_{l=1}^{J} \prod_{m=1}^{l} R_{pi+m}}{J+1} \quad (23)$$

Examples of Parameterization of the Puncturer During Implementations of the Invention For the following examples, the telecommunications equipments under consideration are compatible with an IEEE 802.11ax standard. The encoder COD performs ½ rate convolutional coding and it has a constraint length L=7. The target MCSs (Modulation and Coding Schemes) under consideration are ¾ 16-QAM, ¾ 64-QAM. 5/6 64-QAM are specified by this standard.

According to a first use case, the puncturer implemented according to the invention modifies the protection of the bits within each symbol along with the protection of the symbols furthest from the center of the constellation, while at the same time keeping the coding rate set by the MCS unchanged.

According to a first example, the MCS of index 4 is a ¾ 16-QAM.

The MCS is constant for all of the symbols of the constellation, which means that the useful information data rate is not modified by the invention and is identical for all of the points of the constellation. This therefore makes it necessary to generate multiple pairs ($R_{p1}$, $R_{p2}$) depending on the distance R to the center of the constellation.

Two separate levels are considered according to the distance for the distances R0, R1, on the one hand, and for the distance R2, on the other hand. A puncturer with an elementary structure (two branches/two outputs {S1, S2}) and two separate parameterizations may therefore be suitable since two levels of protection are obtained for each of the two parameterizations. The two outputs of the puncturer make it possible to distinguish between data mapped onto the most significant bit and data mapped onto the least significant bit of one and the same symbol.

The two parameterizations correspond to two pairs of values ($R_{p1}$, $R_{p2}$) respectively for the points located at the distances R0 and R1 and for those located at the distance R2 from the center of the constellation. The constraint of an unchanged rate $R_{MCS}$ regardless of the point of the constellation imposes a set of two pairs of values ($R_{p1}$, $R_{p2}$).

The rate of the mother code of the channel encoder $R_i$=½ and the MCS make it possible to deduce therefrom, according to equation (11), that:

$$R_{eq,elem} = R_{MCS} = \frac{3}{4} = \frac{1}{2} \times R_{p1} \times \frac{1 + R_{p2}}{2} \text{ hence } R_{p1} \times (1 + R_{p2}) = 3$$

Multiple values of $R_{p1}$ and $R_{p2}$ may be selected according to the protection chosen depending on the distance to the center of the constellation. The ratios $R_{p1}$ and $R_{p2}$ are greater than or equal to one by virtue of the puncturing operation. The channel coding rates $R_{S1}$ and $R_{S2}$ on each of the branches S1 and S2 are less than or equal to one.

For Points at the Distance R2.

For example, if $$R_{p1} = \frac{6}{5},$$

then $$R_{p2} = \frac{9}{6} = \frac{3}{2}.$$

According to equation (12), the equivalent channel coding rates on the branches S1 and S2 are given by:

$$R_{S1} = R_i \times R_{p1} = \frac{1}{2} \times \frac{6}{5} = \frac{3}{5}$$

$$R_{S2} = R_i \times R_{p1} \times R_{p2} = \frac{1}{2} \times \frac{6}{5} \times \frac{3}{2} = \frac{9}{10}$$

The branch S1 is assigned to the least significant bits with an equivalent rate equal to 3/5, while the branch S2 is assigned to the most significant bits with a rate 9/10. The overall rate is indeed equal to ¾. The associated puncturing matrices are formed of two rows and may comprise three columns. They may be in the form:

$$P1 = \begin{pmatrix} 1 & 1 & 1 \\ 0 & 1 & 1 \end{pmatrix}$$

and $$P2 = \begin{pmatrix} 1 & 0 & 1 \\ 1 & 1 & 0 \end{pmatrix}$$

For Points Located at the Distances R0 and R1.

A second pair ($R_{p1}$, $R_{p2}$) is determined considering a higher rate $R_{S1}$ for the least significant bits than for the points at the distance R2, since the decision region of the symbols is identical to that of the least significant bits.

For example $$R_{S1} = \frac{2}{3} > \frac{3}{5}$$

Then $$R_{S1} = \frac{2}{3} = R_i \times R_{p1} = \frac{1}{2} \times R_{p1},$$

hence $$R_{p1} = \frac{4}{3}$$

And since $$R_{p1} \times (1 + R_{p2}) = 3,$$

then $$R_{p2} = \frac{5}{4} = \frac{10}{8}$$

The rates on each branch are therefore:

$$R_{s1} = \frac{2}{3}$$

and $$R_{s2} = R_i \times R_{p1} \times R_{p2} = \frac{1}{2} \times \frac{4}{3} \times \frac{5}{4} = \frac{5}{6}$$

The corresponding puncturing matrices may take the form:

$$P1 = \begin{pmatrix} 1 & 1 \\ 0 & 1 \end{pmatrix}$$

and $$P2 = \begin{pmatrix} 1 & 1 & 1 & 0 & 1 \\ 1 & 0 & 1 & 1 & 1 \end{pmatrix}$$

[Table 5] in the Appendix gives a summary of the values for this example.

According to a second example, the modulation is a ¾ 64-QAM and the puncturing according to the invention is implemented for only certain symbols, those at the distance R2, that is to say furthest from the center. The MCS remains constant for all of the symbols. [Table 6] in the Appendix gives a summary of the values for this example. The method implements two puncturing pairs and therefore with an equivalent channel coding rate; one pair for the data mapped onto the symbols at the distances R0 and R1, one pair for the data mapped onto the symbols at the distance R2. The table gives two values (2/3, 5/6) (3/5, 9/10) of the pair of equivalent channel coding rates for the data mapped onto the symbols at the distance R2.

According to a third example, the modulation is a ¾ 64-QAM. Considering that the 64-QAM modulation is constructed with two 32-QAM modulations, then three bits are associated with each symbol of an 8-QAM constellation. Three different levels of protection may therefore be used to protect data differently depending onto which of the three bits they are mapped.

The selected puncturer comprises two cascaded elementary structures, which makes it possible to obtain three outputs with three equivalent coding rates ($R_{S1}$, $R_{S2}$, $R_{S3}$) and three puncturing ratios ($R_{p1}$, $R_{p2}$, $R_{p3}$).

Three zones Z1, Z2, Z3 of symbols are distinguished between, as illustrated in FIG. 11, depending on their distance to the center of the constellation. To protect these three zones, three different triplets of equivalent coding rates ($R_{S1}$, $R_{S2}$, $R_{S3}$) and puncturing ratios ($R_{p1}$, $R_{p2}$, $R_{p3}$) are determined.

In accordance with the first use case, the code rate set by the MCS is kept unchanged for all of the points of the constellation regardless of their position.

The rate of the mother code of the channel encoder $R_i=½$ and the MCS make it possible to deduce therefrom, according to equation (11), that:

$$R_{eq} = R_{MCS} = \frac{3}{4}$$

and $$R_{eq} = \frac{1}{2} \times R_{p1} \times \frac{(1 + R_{p2} + R_{p2} \times R_{p3})}{3}$$

Hence:

$$R_{p1} \times (1 + R_{p2} + R_{p2} \times R_{p3}) = \frac{9}{2}$$

For example, if $R_{p1}=1$, then it is possible to choose $R_{p2}=6/4$ and $R_{p3}=14/12$.

The equivalent channel coding rates on each of the branches are then given by:

$$R_{S1} = R_i \times R_{p1} = \frac{1}{2},$$

$$R_{S2} = R_i \times R_{p1} \times R_{p2} = \frac{3}{4}$$

and $$R_{S3} = R_i \times R_{p1} \times R_{p2} \times R_{p3} = \frac{1}{2} \times \frac{6}{4} \times \frac{14}{12} = \frac{7}{8}$$

The branch S3 is assigned to the most significant bits, the branch S2 to the bits of intermediate weight, and the branch S1 to the least significant bits.

The set of puncturing ratios (1, 6/4, 14/12) is considered for the symbols in the zone Z3.

The set of puncturing ratios (9/8, 4/3, 10/8) is considered for the symbols in the zone Z2.

The set of puncturing ratios (4/3, 19/16, 1) is considered for the symbols in the zone Z1.

[Table 7] in the Appendix gives a summary of the values for this above example.

According to a second use case, the puncturer implemented according to the invention keeps the code rate $R_{MCS}$ set by the MCS unchanged on average over all of the symbols of the constellation.

According to this use case, the useful bit rate assigned to the various symbols of the constellation may be different according to their distance to the center of the constellation, while at the same time keeping the average bit rate constant over the M symbols of the modulation of order M. Consideration is given for example to a ¾ 16-QAM modulation with a higher useful data rate for the closest symbols of the constellation, for example at the distances R0 and R1, and a lower useful data rate for the furthest symbols, for example at the distance R2, while at the same time keeping the average data rate unchanged over the M points of the constellation. This is tantamount to defining two equivalent channel coding rates $R_{eq,1}$ and $R_{eq,2}$, such that the average rate weighted by the numbers of constellation points affected by these two rates corresponds to the following equation:

$$R_{eq} = \frac{N_1 R_{eq,1} + N_2 R_{eq,2}}{N_1 + N_2} = R_{MCS}$$

$$N_1 + N_2 = M$$

$N_1$ is the number of points of the constellation having the equivalent rate $R_{eq,1}$ and $N_2$ is the number of points of the constellation having the equivalent rate $R_{eq,2}$.

For example, $N_1=12$ and $N_2=4$. Then, assuming $R_{eq,1}>R_{eq,2}$, it is necessary to solve the equation $$12\times R_{eq,1} + 4\times R_{eq,2} = \frac{3}{4}\times 16 = 12.$$

For example, $$(R_{eq,1}, R_{eq,2}) = \left(\frac{5}{6}, \frac{1}{2}\right)$$

this being tantamount to not puncturing the bits mapped onto the furthest symbols in the constellation, located in the zone 2, that is to say at the distance R2.

For the zone 1, that is to say the symbols at the distances R0 and R1, the rate is equal to 5/6. The method may uniformly apply standard puncturing to all bits mapped onto the symbols in the zone 1. Or, alternatively, the method may apply variable puncturing within each symbol of the zone 1 such that:

$$R_{eq,1} = \frac{5}{6} = \frac{1}{2}\times R_{p1}\times\frac{1+R_{p2}}{2} \rightarrow R_{p1}\times(1+R_{p2}) = \frac{10}{3}$$

Multiple values satisfy the above equation. For example, $$\{R_{p1}, R_{p2}\} = \left\{\frac{3}{2}, \frac{11}{9}\right\}$$

APPENDIX

TABLE 1

| Symbol index | Symbol value | Pure binary coding on 4 bits $b_3$ | $b_2$ | $b_1$ | $b_0$ | Gray coding on 4 bits $G_3$ | $G_2$ | $G_1$ | $G_0$ |
|---|---|---|---|---|---|---|---|---|---|
| 0 | −15 | 0 | 0 | 0 | 0 | 0 | 0 | 0 | 0 |
| 1 | −13 | 0 | 0 | 0 | 1 | 0 | 0 | 0 | 1 |
| 2 | −11 | 0 | 0 | 1 | 0 | 0 | 0 | 1 | 1 |
| 3 | −9 | 0 | 0 | 1 | 1 | 0 | 0 | 1 | 0 |
| 4 | −7 | 0 | 1 | 0 | 0 | 0 | 1 | 1 | 0 |
| 5 | −5 | 0 | 1 | 0 | 1 | 0 | 1 | 1 | 1 |
| 6 | −3 | 0 | 1 | 1 | 0 | 0 | 1 | 0 | 1 |
| 7 | −1 | 0 | 1 | 1 | 1 | 0 | 1 | 0 | 0 |
| 8 | 1 | 1 | 0 | 0 | 0 | 1 | 1 | 0 | 0 |
| 9 | 3 | 1 | 0 | 0 | 1 | 1 | 1 | 0 | 1 |
| 10 | 5 | 1 | 0 | 1 | 0 | 1 | 1 | 1 | 1 |
| ... | ... | ... | ... | ... | ... | ... | ... | ... | ... |
| 14 | 13 | 1 | 1 | 1 | 0 | 1 | 0 | 0 | 1 |
| 15 | 15 | 1 | 1 | 1 | 1 | 1 | 0 | 0 | 0 |

TABLE 2

| Symbol index | Symbol value | Pure binary coding on 3 bits $b_2$ | $b_1$ | $b_0$ | Gray coding on 3 bits $G_2$ | $G_1$ | $G_0$ |
|---|---|---|---|---|---|---|---|
| 0 | −7 | 0 | 0 | 0 | 0 | 0 | 0 |
| 1 | −5 | 0 | 0 | 1 | 0 | 0 | 1 |
| 2 | −3 | 0 | 1 | 0 | 0 | 1 | 1 |
| 3 | −1 | 0 | 1 | 1 | 0 | 1 | 0 |
| 4 | 1 | 1 | 0 | 0 | 1 | 1 | 0 |
| 5 | 3 | 1 | 0 | 1 | 1 | 1 | 1 |
| 6 | 5 | 1 | 1 | 0 | 1 | 0 | 1 |
| 7 | 7 | 1 | 1 | 1 | 1 | 0 | 0 |

TABLE 3

| Symbol index | 16-ary symbol for a 16-QAM modulation $b_3b_2$ | Channel I | $b_1b_0$ | Channel Q |
|---|---|---|---|---|
| 0 | 00 | −3 | 00 | −3 |
| 1 | 01 | −1 | 01 | −1 |
| 2 | 11 | 1 | 11 | 1 |
| 3 | 10 | 3 | 10 | 3 |

TABLE 4

| Symbol index | 64-ary symbol for a 64-QAM modulation $b_5b_4b_3$ | Channel I | $b_2b_1b_0$ | Channel Q |
|---|---|---|---|---|
| 0 | 000 | −7 | 000 | −7 |
| 1 | 001 | −5 | 001 | −5 |
| 2 | 011 | −3 | 011 | −3 |
| 3 | 010 | −1 | 010 | −1 |
| 4 | 110 | 1 | 110 | 1 |
| 5 | 111 | 3 | 111 | 3 |
| 6 | 101 | 5 | 101 | 5 |
| 7 | 100 | 7 | 100 | 7 |

TABLE 5

| Modulation | | 3/4 16-QAM | | |
|---|---|---|---|---|
| Bit mapping | | $(b_3, b_1) \rightarrow R_{s2}$ | $(b_2, b_0) \rightarrow R_{s1}$ | |
| Distance | $(R_{p1}, R_{p2})$ | (P1, P2)<br>Pi (nb. rows, nb. columns) | $(R_{S1}, R_{S2})$ | $R_{eq}$ |
| $R1 = \sqrt{10}$ a<br>$R0 = \sqrt{2}$ a | $\left(\frac{4}{3}, \frac{10}{8}\right)$ | P1 = (2, 2)<br>1 punctured element<br>P2 = (2, 5 )<br>2 punctured elements | $\left(\frac{2}{3}, \frac{5}{6}\right)$ | 3/4 |
| $R2 = 3\sqrt{2}$ a | $\left(\frac{6}{5}, \frac{6}{4}\right)$ | P1 = (2, 3)<br>1 punctured element<br>P2 = (2, 3)<br>2 punctured elements | $\left(\frac{3}{5}, \frac{9}{10}\right)$ | 3/4 |

TABLE 6

| Modulation | | 3/4 16-QAM | | |
|---|---|---|---|---|
| Bit mapping | | $(b_3, b_1) \rightarrow R_{s2}$ | $(b_2, b_0) \rightarrow R_{s1}$ | |
| Distance | $(R_{p1}, R_{p2})$ | $(P_1, P_2)$<br>Pi (nb. rows, nb. columns) | $(R_{s1}, R_{s2})$ | $R_{eq}$ |
| $R1 = \sqrt{10}$ a<br>$R0 = \sqrt{2}$ a | $\left\{\frac{6}{4}, 1\right\}$ | P1Standard (2, 3)<br>puncturing matrix<br>P2 formed of 1s (1, 1) | $\left\{\frac{3}{4}, \frac{3}{4}\right\}$ | 3/4 |
| $R2 = 3\sqrt{2}$ a | $\left\{\frac{4}{3}, \frac{10}{8}\right\}$ | P1 = (2, 2)<br>1 punctured element<br>P2 = (2, 5)<br>2 punctured elements | $\left\{\frac{2}{3}, \frac{5}{6}\right\}$ | 3/4 |
| $R2 = 3\sqrt{2}$ a | $\left\{\frac{6}{5}, \frac{6}{4}\right\}$ | P1 = (2, 3)<br>1 punctured element<br>P2 = (2, 3)<br>2 punctured elements | $\left\{\frac{3}{5}, \frac{9}{10}\right\}$ | 3/4 |

TABLE 7

| 3/4 64-QAM | | | $(b_5, b_2) \rightarrow R_{S3}$<br>$(b_4, b_1) \rightarrow R_{S2}$<br>$(b_3, b_0) \rightarrow R_{S1}$ |
|---|---|---|---|
| Distance | $(R_{p1}, R_{p2}, R_{p3})$ | (P1, P2, P3)<br>Pi (nb. rows, nb. columns) | $(R_{S1}, R_{S2}, R_{S3})$ |
| Zone 3 | $\left(1, \frac{6}{4}, \frac{14}{12}\right)$ | P1 = (2, 1)<br>0 punctured elements<br>P2 = (2, 3)<br>2 elements punctured with the standard matrix<br>P3 = (2, 7)<br>2 elements punctured with a matrix to be defined | $\left\{\frac{1}{2}, \frac{3}{4}, \frac{7}{8}\right\}$ |
| Zone 2 | $\left(\frac{9}{8}, \frac{4}{3}, \frac{10}{8}\right)$ | P1 = (2, 9)<br>2 punctured elements<br>P2 and P3 may be the matrices given in example 1 | $\left(\frac{9}{16}, \frac{3}{4}, \frac{15}{16}\right)$ |
| Zone 1 | $\left(\frac{4}{3}, \frac{19}{16}, 1\right)$ | | $\left(\frac{2}{3}, \frac{19}{24}, \frac{19}{24}\right)$ |

Although the present disclosure has been described with reference to one or more examples, workers skilled in the art will recognize that changes may be made in form and detail without departing from the scope of the disclosure and/or the appended claims.

The invention claimed is:

1. A data transmission method, implemented by a first equipment, for transmitting data to a second telecommunications equipment, comprising:

coding input data by using an encoder, puncturing the data after coding, modulation, with mapping of the data after puncturing onto a symbol from among M symbols of a constellation of order M, $M=2^q$ q>=2, wherein the puncturing of the data is different depending on a position of the symbol in the constellation onto which these data are mapped after puncturing.

2. The data transmission method as claimed in claim 1, comprising evaluating the position of the symbol by computing a metric for evaluating a distance from the symbol to a center of the constellation.

3. The data transmission method as claimed in claim 1, such that the puncturing makes it possible to distinguish between at least two levels of protection associated with symbols positioned at different distances to a center of the constellation.

4. The data transmission method as claimed in claim 1, the symbols of the constellation comprising bits, decision regions being associated with the bits, the method being such that the puncturing difference depends on the decision regions.

5. The data transmission method as claimed in claim 1, at least one symbol of the constellation comprising at least two bits of different weight, the method being such that the puncturing of the data mapped onto this at least one symbol is different depending on the weight of the bits in this at least one symbol.

6. The data transmission method as claimed in claim 5, wherein the puncturing difference between data mapped onto the at least one symbol applies for all of the symbols of the constellation.

7. The data transmission method as claimed in claim 5, wherein the puncturing difference between data mapped onto the at least one symbol applies only for some of the symbols of the constellation.

8. The data transmission method as claimed in claim 1, wherein each symbol of the constellation comprises at least one most significant bit and one least significant bit and the puncturing of the data is different between data mapped onto the most significant bit and data mapped onto the least significant bit of the symbol.

9. The data transmission method as claimed in claim 8, such that the puncturing difference between data mapped onto one and the same symbol applies for all of the symbols of the constellation.

10. The data transmission method as claimed in claim 8, such that the puncturing difference between data mapped onto one and the same symbol applies only for some of the symbols of the constellation.

11. The data transmission method as claimed in claim 1, the puncturing of the data being in accordance with at least two different levels of protection respectively for data mapped onto bits of different weight of one and the same symbol, wherein:

the puncturing comprises at least one puncturing step comprising a first puncturing matrix an output of which is supplied to a demultiplexing stage having a first and a second output, the second output being supplied to a second puncturing matrix so as to define at least two different levels of protection obtained with the first output of the demultiplexing stage and an output of the second puncturing matrix, respectively.

12. The data transmission method as claimed in claim 11, such that the puncturing, referred to as previous step, is followed by a new puncturing step whose first matrix is common with the second matrix of the previous step, so as to define an additional different level of protection that is obtained with the output of the second puncturing matrix from the new puncturing step.

13. The data transmission method as claimed in claim 11, wherein a puncturing ratio is associated with each puncturing matrix, and wherein levels of protection of the data are changed by modifying the ratio of at least one of the puncturing matrices.

14. A method for communication between a first equipment and a second telecommunications equipment, wherein the method is implemented by the second telecommunications equipment and comprises:

receiving a data signal, data of the data signal being mapped before transmission onto symbols of a constellation of order M, $M=2^q$ q>=2, demodulating the symbols with demapping of the data, depuncturing the data after demapping of the data, wherein a puncturing of the data at transmission is different depending on a position of the symbol in the constellation onto which these data are mapped after puncturing, and decoding the data after depuncturing.

15. The communication method as claimed in claim 14, each symbol of the constellation comprising at least two bits of different weight, the method being such that the depuncturing of the data takes into account the puncturing at transmission, which depends on the weight of the bits in a symbol onto which the data are mapped.

16. A telecommunications equipment to communicate with a second equipment wherein the telecommunications equipment comprises:

at least one computer; and at least one non-transitory computer readable medium comprising instructions stored thereon which when executed by the at least one computer configure the telecommunications equipment to perform a method comprising:

coding input data, puncturing the data after coding, modulating the data after puncturing by mapping the data after puncturing onto a symbol from among M symbols of a constellation of order M, $M=2^q$ q>=2, wherein the puncturing of the data is different depending on the position of the symbol in the constellation onto which these data are mapped after puncturing.

17. The telecommunications equipment as claimed in claim 16, wherein the puncturing comprises:

using an elementary structure comprising a first puncturing matrix an output of which is supplied to a demultiplexing stage having a first and a second output, the second output being supplied to a second puncturing matrix so as to define the at least two different levels of protection obtained with the first output of the demultiplexing stage and an output of the second puncturing matrix, respectively.

18. The telecommunications equipment as claimed in claim 16, further comprising:

a transmit antenna; and a transmitter configured to transmit the data after the modulating using the transmit antenna.

19. A telecommunications equipment to communicate with a first equipment in order to receive a data signal, data of the data signal being mapped before transmission onto symbols of a constellation of order M, $M=2^q$ q>=2, wherein the telecommunications equipment comprises:

at least one computer; and at least one non-transitory computer readable medium comprising instructions stored thereon which when executed by the at least one computer configure the telecommunications equipment to perform a method comprising:

demodulating symbols with demapping of the data, depuncturing the data after demapping of the data, puncturing of the data at transmission being different depending on a position of the symbol in the constellation onto which these data are mapped after puncturing, and decoding the data after depuncturing.

20. The telecommunications equipment as claimed in claim 19, further comprising:

a receive antenna; and a receiver configured to receive the data signal using the receive antenna.

* * * * *